United States Patent
Fukushima et al.

(10) Patent No.: US 10,712,559 B2
(45) Date of Patent: Jul. 14, 2020

(54) DISPLAY DEVICE

(71) Applicant: NIPPON SEIKI CO., LTD., Niigata (JP)

(72) Inventors: Yuichi Fukushima, Niigata (JP); Yasuhiro Yamakawa, Niigata (JP)

(73) Assignee: NIPPON SEIKI CO., LTD., Niigata (JP)

(*) Notice: Subject to any disclaimer, the term of this patent is extended or adjusted under 35 U.S.C. 154(b) by 0 days.

(21) Appl. No.: 16/477,709

(22) PCT Filed: Jan. 16, 2018

(86) PCT No.: PCT/JP2018/000948
§ 371 (c)(1),
(2) Date: Jul. 12, 2019

(87) PCT Pub. No.: WO2018/135462
PCT Pub. Date: Jul. 26, 2018

(65) Prior Publication Data
US 2019/0361235 A1 Nov. 28, 2019

(30) Foreign Application Priority Data
Jan. 17, 2017 (JP) .................. 2017-005903

(51) Int. Cl.
*G02B 27/01* (2006.01)
*B60K 35/00* (2006.01)
*G09G 3/20* (2006.01)

(52) U.S. Cl.
CPC .......... *G02B 27/0103* (2013.01); *B60K 35/00* (2013.01); *G02B 2027/0118* (2013.01); *G09G 3/20* (2013.01)

(58) Field of Classification Search
CPC ........ G02B 27/0103; G02B 2027/0118; G02B 27/01; B60K 35/00; G09G 3/20; G03B 21/14; G03B 21/00
See application file for complete search history.

(56) References Cited

U.S. PATENT DOCUMENTS

| | | | |
|---|---|---|---|
| 2007/0063939 A1* | 3/2007 | Bellamy | G02F 1/13452 345/87 |
| 2016/0247457 A1* | 8/2016 | Kim | G09G 3/3291 |
| 2017/0285330 A1 | 10/2017 | Uchiyama et al. | |

FOREIGN PATENT DOCUMENTS

| JP | 2009-212328 A | 9/2009 |
|---|---|---|
| JP | 2014-066920 A | 4/2014 |

(Continued)

OTHER PUBLICATIONS

International Search Report issued in corresponding International Patent Application No. PCT/JP2018/000948, dated Mar. 27, 2018, with English Translation.

*Primary Examiner* — Abbas I Abdulselam
(74) *Attorney, Agent, or Firm* — McDermott Will & Emery LLP

(57) ABSTRACT

A display device includes: an illumination unit having a light source unit capable of emitting light; an illumination control unit controlling the illumination unit; a display element capable of forming an image with illumination light from the illumination unit; a display control unit controlling the display element; a control unit controlling the display control unit and the illumination control unit based on a video signal; and a first circuit board on which the display element and the display control unit are mounted. When the display element and the display control unit are mounted on the surface of the first circuit board, a first signal for controlling pixels of the display element is arranged only on the front surface of the first circuit board, while a main portion of a (Continued)

second signal for setting control regarding the pixels is arranged on the rear surface of the first circuit board.

7 Claims, 9 Drawing Sheets

(56) References Cited

FOREIGN PATENT DOCUMENTS

| | | |
|---|---|---|
| JP | 2015-179152 A | 10/2015 |
| JP | 2016-045388 A | 4/2016 |
| JP | 2017-181625 A | 10/2017 |

* cited by examiner

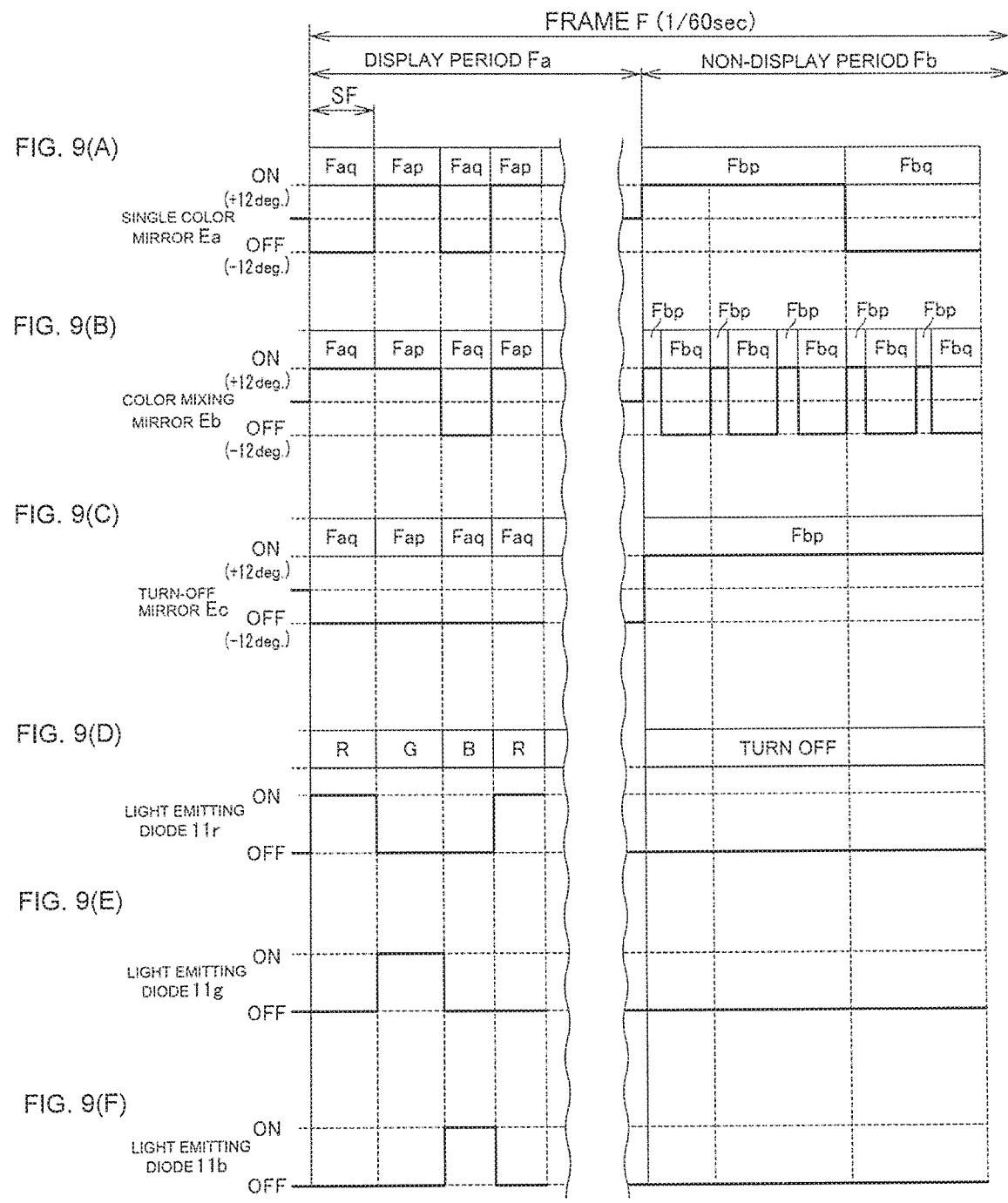

DISPLAY DEVICE

CROSS REFERENCE

This application is the U.S. National Phase under 35 U.S.C. § 371 of International Application No. PCT/JP2018/000948, filed on Jan. 16, 2018, which claims the benefit of Japanese Application No. 2017-005903, filed on Jan. 17, 2017, the entire contents of each are hereby incorporated by reference.

TECHNICAL FIELD

The present invention relates to a display device that displays an image.

BACKGROUND ART

Patent Document 1, for example, discloses a head-up display device as a display device and the disclosed head-up display device includes a control board, a backlight board, and a liquid crystal driving board. The control board of Patent Document 1 is able to control the backlight board and the liquid crystal driving board, and cause a light source unit to emit an image of an instrument as display light.

Patent Document 2, for example, discloses a head-up display device, and the disclosed head-up display device includes a control board and a projector. The control board of Patent Document 2 is able to control the projector and cause a vehicle occupant to visually recognize a virtual image of a video projected on a screen.

Patent Document 3, for example, discloses a display device, and the disclosed display device includes a control unit, an illumination control unit, and a display control unit. The control unit of Patent Document 3 is able to control the illumination control unit and the display control unit, and cause a vehicle occupant to visually recognize a virtual image of light from a screen (a display image).

More specifically, Patent Document 3 discloses a display device that displays an image in, for example, the field sequential format. The disclosed display device includes an illumination device, a light intensity detection unit, an illumination optical system, a display element, a projection optical system, a screen, a planar mirror, a concave mirror, a casing, and a translucent portion. In the display device of Patent Document 3, it is possible to change luminance of the illumination device according to luminance required for a display image to be displayed on the screen. Specifically, in the display device of Patent Document 3, two driving methods, for example, are employed as driving methods of the light source unit of the illumination device, and it is possible to change the luminance of the illumination device by changing a combination of a control value required for a PWM driving method (e.g., a duty cycle) and a control value required for a PAM driving method (e.g., a current value).

In the display device of Patent Document 3, a ratio of a display period in a frame period (a time period in which a display element is able to display a display image on the screen) may be constant (e.g., 50%) or may be determined according to luminance required for the display image (e.g., 50% or 70%).

PRIOR ART DOCUMENT

Patent Document

Patent Document 1: Japanese Unexamined Patent Application Publication No. 2016-045388

Patent Document 2: Japanese Unexamined Patent Application Publication No. 2015-179152

Patent Document 3: Japanese Unexamined Patent Application Publication No. 2014-066920

SUMMARY OF THE INVENTION

Problems to be Solved by the Invention

In the head-up display device of Patent Document 1, a drive circuit on the liquid crystal driving board of Patent Document 1 drives a liquid crystal panel by changing a degree of transmission of each pixel of the liquid crystal panel on the liquid crystal driving board by a control signal based on a video signal representing an image of an instrument from the control board so that a predetermined image is emitted as display light. Therefore, in order to drive the liquid crystal panel, it is necessary to dispose a wiring cable (in a broad sense, wiring) which is, for example, a flexible flat cable between the control board and the liquid crystal driving board, and dispose circuit wiring (in a broad sense, wiring) between the drive circuit and the liquid crystal panel on the liquid crystal driving board. Those skilled in the art may also refer to the circuit wiring on the circuit board as circuit board wiring.

In the head-up display device of Patent Document 2, it is necessary to dispose a wiring cable for transmitting a video signal representing a video between the control board and the projector of Patent Document 2, and dispose, on the circuit board in the projector, circuit wiring (circuit board wiring) for transmitting a control signal for controlling the projector based on the video signal.

In the display device of Patent Document 3, it is necessary to dispose wiring for transmitting display control data based on a video signal representing an image between the control unit and the display control unit of Patent Document 3, and dispose wiring for transmitting control data (a control signal) for controlling ON/OFF of each mirror (each pixel) of a DMD between the display control unit and the display element (specifically, a DMD, for example, which is a reflective display element).

In general, countermeasures against noise of circuit wiring (circuit board wiring) among circuit components on a circuit board may be implemented by, for example, impedance matching. That is, quality of a signal transmitted through circuit wiring (circuit board wiring) is lowered due to impedance mismatch, for example. Countermeasures against noise of a wiring cable between circuit boards may be implemented by, for example, a twisted pair cable.

In general, the total number or density of a plurality of pixels that form a liquid crystal panel, or the total number or density of a plurality of mirrors that form a DMD relates to the resolution of a display device. As the resolution becomes higher, display quality of the display device becomes higher. As the resolution of the display device becomes higher, the total number of circuit wirings (circuit board wirings) becomes higher. Alternatively, in order to suppress the total number of circuit wirings (circuit board wirings), a transmission rate of the circuit wiring (the circuit board wiring) is increased. Therefore, an increase in the number of circuit wirings (circuit board wirings) increases an area of a circuit board. Alternatively, when the transmission rate of the circuit wiring (circuit board wiring) increases, impedance matching becomes more important.

In general, a circuit board that forms a display device is desirably a single circuit board for simplicity. However, in Patent Documents 1 and 2, a display device is formed by two or more circuit boards and, in Patent Document 3, a circuit board in an illumination device is disclosed but specific circuit boards that form a control unit, the illumination control unit, and a display control unit are not disclosed. The present inventors have recognized that it is desirable to prevent an increase in the number of circuit boards and to arrange appropriate circuit components on each circuit board. That is, the present inventors have recognized that it is desirable to determine arrangement of circuit components so as not to cause defects in the display of images. In particular, the present inventors have recognized that, when a DMD is employed as a display element, it is desirable to determine arrangement of circuit components so as not to cause defects in the display of the DMD (specifically, not to affect the temperature of the DMD).

It is suggested in Patent Document 3 to acquire light intensity data from a light intensity detection unit and to correct a divergence between luminance required for a display image to be displayed on a screen and actual luminance of an illumination device (an illumination unit). However, concrete methods therefor are not disclosed.

An object of the present invention is to provide a display device in which display quality of an image is able to be improved. Another object of the present invention is to provide a display device in which an increase in size of a circuit board is able to be suppressed. Other objects of the present invention will become apparent to those skilled in the art from the aspects and the best modes described as examples, and attached drawings.

Note that a further object may be, for example, to provide a display device in which display of an image is able to be controlled precisely. In addition to or instead of the above object, a further object may be, for example, to provide a display device in which luminance of an illumination unit is able to be controlled precisely.

Solution to Problem

Aspects in accordance with the present invention will be described for easy understanding of the summary of the present invention.

In a first aspect, a display device includes:
an illumination unit that includes a light source unit capable of emitting light;
an illumination control unit that controls the illumination unit;
a display element capable of forming a display image with illumination light from the illumination unit;
a display control unit that controls the display element;
a first control unit that controls the illumination control unit and the display control unit based on a video signal; and
a first circuit board on which the display element and the display control unit are mounted, wherein
based on the video signal, the display control unit transmits a first signal for controlling a plurality of pixels that form the display element to the display element and transmits a second signal for setting control of the plurality of pixels to the display element,
the display element drives the plurality of pixels based on the first signal and the second signal, and the display element and the display control unit are mounted on one of a front surface and a back surface of the first circuit board,
first wiring for transmitting the first signal is disposed only on the one of the front surface and the back surface,
the first circuit board is a multilayer circuit board including a first via portion that electrically connects the front surface and the back surface, and second wiring for transmitting the second signal includes
the first portion that is a first portion connecting the display control unit and the first via portion and is disposed only on the one of the front surface and the back surface, and
the second portion that is a second portion disposed only on the other of the front surface and the back surface and extends from the first via portion toward the display element.

In the first aspect, the wiring between the display control unit and the display element is formed by the first wiring and the second wiring, and the first wiring for transmitting the first signal for controlling a plurality of pixels that form the display element is disposed on the same surface (e.g., a front surface) of the first circuit board as the display control unit and the display element are. The second wiring for transmitting the second signal for setting control of a plurality of pixels that form the display element includes the second portion, and the second portion is disposed on the other surface (e.g., the back surface) of the first circuit board. Since the first wiring with a large amount of information is disposed on the same surface of the first circuit board as the display control unit and the display element are, the first signal is not bypassed to the other surface of the first circuit board and is not connected to the first via portion. Since control (e.g., ON/OFF control) of a plurality of pixels (e.g., mirrors) that form the display element (e.g., the DMD) is related directly to display quality of an image, display quality of an image is able to be improved by disposing the first wiring for transmitting the first signal with priority.

The second wiring is connected to the first via portion. The second signal (e.g., a refresh rate) for setting control of pixels (e.g., mirrors) has a small amount of information, so the second signal does not largely affect display quality of an image. That is, even in a rare situation in which refreshing is not performed once, reduction in display quality of an image due to that single non-execution of refreshing is difficult to be visually recognized. Since (the second portion of) the second signal is bypassed to the other surface of the first circuit board, it is possible to suppress an increase in an area of the first circuit board (e.g., a surface area) by the bypassed area of the second signal.

In a second aspect depending on the first aspect,
the first signal may include a first differential signal transmitted at a first transmission rate through the first wiring,
the second signal may include a second differential signal transmitted at a second transmission rate through the second wiring, and
the first transmission rate may be higher than the second transmission rate.

In general, as the transmission rate becomes higher, an impedance will be more easily changed at a connecting portion when the wiring is connected to a via. That is, as the transmission rate becomes higher, the signal will be more easily reflected at the connecting portion, and a waveform of the signal will deteriorate more easily due to reflected noise.

Accordingly, in the second aspect, since the first wiring for transmitting the first signal on a high speed side is disposed only on one of the front surface and the back surface of the first circuit board and is not connected to the first via portion, it is possible to prevent reduction in display quality of an image.

In a third aspect depending on the second aspect,
a first signal quality adjustment element that adjusts a waveform of the first differential signal may be disposed on the side of the display control unit, and a distance between the first signal quality adjustment element and the display control unit may be shorter than a distance between the first signal quality adjustment element and the display element.

In the third aspect, the first signal quality adjustment element is disposed near the display control unit. That is, since the first signal reaches the first signal quality adjustment element immediately after being transmitted from the display control unit, it is possible, thereafter, to prevent deterioration of the first signal before reaching the display element.

In a fourth aspect depending on the second or the third aspect,
- a second signal quality adjustment element that adjusts a waveform of the second differential signal may be disposed on the side of the display control unit, a distance between the second signal quality adjustment element and the display control unit may be shorter than a distance between the second signal quality adjustment element and the display element, and
- the second signal quality adjustment element may be formed inside the first portion of the second wiring disposed only on the one of the front surface and the back surface.

In the fourth aspect, the second signal quality adjustment element is positioned near the display control unit. That is, after being transmitted from the display control unit, the second signal immediately reaches the second signal quality adjustment element before reaching the first via unit, it is possible, thereafter, to prevent deterioration of the second signal before reaching the display element.

In a fifth aspect depending on any one of the second to the fourth aspects,
- the multilayer circuit board that forms the first circuit board may include a first layer that forms the front surface, a second layer positioned immediately below the first layer, a third layer positioned below the second layer, and a fourth layer positioned immediately below the third layer,
- the fourth layer may form the back surface,
- the second layer may be a first ground layer, and
- the third layer may be a second ground layer.

In the fifth aspect, the first wiring for transmitting the first signal (e.g., the first wiring formed on the first layer which is a front surface of the first circuit board) is positioned near one of the first ground layer and the second ground layer (e.g., the first ground layer which is the second layer positioned immediately below the first layer). Similarly, the second wiring for transmitting the second signal (e.g., the second wiring formed on the fourth layer which is a back surface of the first circuit board) is positioned near the other of the first ground layer and the second ground layer (e.g., the second ground layer which is the third layer positioned immediately above the fourth layer). Therefore, a characteristic impedance of the first wiring and a characteristic impedance of the second wiring are easily modeled or calculated, and impedance matching is easily formed with respect to connecting portions with the first wiring and the connecting portion to the second wiring.

In a sixth aspect depending on any one of the first to the fifth aspects,
- the display control unit may be a surface mount type circuit component, and may be surface-mounted on the one of the front surface and the back surface,
- the display element may be mounted on the one of the front surface and the back surface via an insertion type connector, and
- the second portion of the second wiring disposed only on the other of the front surface and the back surface may connect the first via portion and the connector.

In the sixth aspect, since the connector for mounting the display element on the first circuit board is an insertion type circuit component, the display element is connected to the second wiring on the back surface of the first circuit board via the connector. That is, in the sixth aspect, it is not necessary for the first circuit board to include a second via portion for connecting the second portion of the second wiring on the back surface and the display element, deterioration of the second signal can be prevented.

In a modification of the first aspect, for example,
- the control unit may include a first control unit that controls the illumination control unit with illumination control data based on a video signal, and
- the display device may further include a second circuit board on which the illumination control unit is mounted.

In a modification of the first aspect, a display element capable of forming a display image is mounted on a first circuit board, while an illumination control unit that controls an illumination unit including a light source unit capable of emitting light is mounted on a second circuit board. Since the illumination control unit controls the illumination unit including the light source unit, a heat generation amount of the illumination control unit to cause the illumination unit (the light source unit) to emit light typically increases. Also, the present inventors have recognized that display quality in the display element depends on the temperature of the display element. That is, in order to stabilize the operation of the display element, the present inventors have mounted the illumination control unit and the display element on separate circuit boards to prevent heat from the illumination control unit from being transferred to the display element.

Further, since the display control unit controls the display element, wiring between the display element and the display control unit is able to be simplified by mounting the display element and the display control unit on the same circuit board. Alternatively, by mounting the display element and the display control unit on the same circuit board, it is possible to efficiently connect the display element and the display control unit electrically.

In a modification of the first aspect, for example,
- the illumination control unit may include a driver for driving the light source unit.

In the modification of the first aspect, the illumination control unit is a driver which consumes current to drive a light source unit, so the illumination control unit easily generates heat. Therefore, in the modification of the first aspect, it is possible to prevent the heat from the driver from being transferred to the display element by mounting the driver and the display element on separate circuit boards.

In a modification of the first aspect, for example,
- the illumination control unit may further include a driver driving power supply unit that supplies a driving power supply of the driver.

In the modification of the first aspect, the illumination control unit is a driver and driver driving power supply unit, and the driver driving power supply unit is also a source of the power for driving the driver, so that it easily generates heat. Therefore, in the modification of the first aspect, by mounting the driver and the driver driving power supply unit and the display element on different circuit boards, it is possible to prevent heat from the driver and the driver driving power supply unit from being transferred to the display element.

In a modification of the first aspect, for example,
the first control unit may further be mounted on the first circuit board.

The first control unit generates illumination control data based on the video signal. Therefore, in the modification of the first aspect, by, for example, mounting the illumination control unit which is a driver and the first control unit on separate circuit boards, it is possible to prevent heat from the illumination control unit from being transferred to the first control unit. In the modification of the first aspect, by mounting the display control unit and the first control unit on the same circuit board, it is possible to simplify the wiring between the display control unit and the first control unit.

In a modification of the first aspect, for example,
the display device may further include a first detection unit that detects current output intensity of the light source unit,
the first control unit may store a control value corresponding to target output intensity of the light source unit,
the first control unit may determine a correction value used to correct the control value based on a difference between the target output intensity and the current output intensity detected by the first detection unit, and
the illumination control unit may drive the light source unit based on a control corrected value obtained by correcting the control value by using the correction value.

In a modification of the first aspect, when, for example, the target output intensity is set or changed in accordance with a change in requested luminance, the current output intensity corresponding to the target output intensity before setting or before change may be considered. Specifically, in the modification of the first aspect, a magnitude of a divergence between the current output intensity and the target output intensity after setting or changing may be considered. More specifically, in the modification of the first aspect, when the light source unit is driven with the control value corresponding to the target output intensity after the setting or the change, that control value may be corrected by using a correction value based on a divergence from the current output intensity to the target output intensity. Therefore, the current or the actual output intensity after driving easily matches the target output intensity after setting or changing, and the luminance of the illumination unit is able to be precisely controlled.

In a modification of the first aspect, for example,
when the target output intensity is lower than the current output intensity, the correction value may lower the control value.

In the modification of the first aspect, for example, when the current output intensity is lowered to the target output intensity after setting or changing, the light source unit may be driven with the lowered control value. More specifically, when the first control unit stores the control value corresponding to the target output intensity, the light source unit may be driven with the control corrected value corresponding to the target output intensity lower than the target output intensity after setting or changing. In general, as the target output intensity becomes higher, the temperature of the light source unit becomes higher. Therefore, the present inventors have recognized that, when the current output intensity is lowered to the target output intensity after setting or changing, luminance of the illumination unit is high due to a high temperature state of the light source unit. In the modification of the first aspect, for example, when the current output intensity is lowered to the target output intensity after setting or changing, the light source unit is driven with the lowered control value. Therefore, the luminance of the illumination unit can be precisely controlled.

In a modification of the first aspect, for example,
when the target output intensity is higher than the current output intensity, the correction value may increase the control value.

In the modification of the first aspect, for example, when the current output intensity is increased to the target output intensity after setting or changing, the light source unit may be driven with the increased control value. More specifically, when the first control unit stores the control value corresponding to the target output intensity, the light source unit may be driven with the control corrected value corresponding to the target output intensity higher than the target output intensity after setting or changing. In general, as the target output intensity becomes lower, the temperature of the light source unit becomes lower. Therefore, the present inventors have recognized that, when the current output intensity is increased to the target output intensity after setting or changing, luminance of the illumination unit is low due to a low temperature state of the light source unit. In the modification of the first aspect, for example, when the current output intensity is increased to the target output intensity after setting or changing, the light source unit is driven with the increased control value. Therefore, the luminance of the illumination unit can be precisely controlled.

In a modification of the first aspect, for example,
as the absolute value of the difference between the target output intensity and the current output intensity detected by the first detection unit becomes larger, the absolute value of the correction value may become larger.

In the modification of the first aspect, for example, as a divergence from the current output intensity to the target output intensity becomes wider, the light source unit is driven based on the correction value that has been corrected with strength according to the divergence. Therefore, the luminance of the illumination unit can be precisely controlled.

In a modification of the first aspect, for example,
when the absolute value of a difference between the target output intensity and the current output intensity detected by the first detection unit is smaller than a threshold, the correction value may be zero, and the control corrected value may be the control value corresponding to the target output intensity.

In the modification of the first aspect, when, for example, a divergence from the current output intensity to the target output intensity is small, correction of the control value may be omitted and the light source unit may be driven with the control value corresponding to the target output intensity.

In a modification of the first aspect, for example,
after driving the light source unit based on the control corrected value, the first control unit may take in the current output intensity detected by the first detection unit, and
the correction value may be adjusted such that the current output intensity matches the target output intensity.

In the modification of the first aspect, for example, after driving the light source unit based on the control corrected value, the current output intensity is taken in, desirably the current output intensity is taken in real time, so that the correction value may be adjusted based on a match or a mismatch between the current or the actual output intensity after driving and the target output intensity after setting or changing.

In a modification of the first aspect, for example,
the light source unit may include a plurality of light emitting devices each of which emits each different color,
the illumination control unit may control the illumination unit in the field sequential format so as to drive the light emitting device that is different for each subframe period produced by time division from a frame period of the image,
the first control unit may store the control value corresponding to the target output intensity for each of the light emitting devices, and
the control value may be based on a multiplication value of a duty cycle for PWM-driving a single corresponding light emitting device among the plurality of light emitting devices and a current value for PAM-driving the corresponding single light emitting device.

In the modification of the first aspect, for example, in a display device in the field sequential format, a multiplied value of a duty cycle and a current value when driving a single light emitting device may be employed, for example, as a control value corresponding to a target output intensity.

In a modification of the first aspect, for example,
the display device may further include a second detection unit that detects a current temperature of the light source unit, and
the first control unit may determine the correction value based on the difference between the target output intensity and the current output intensity and the current temperature.

In the modification of the first aspect, when determining the correction value, the current temperature of the light source unit may further be considered. Therefore, the current or the actual output intensity after driving more easily matches the target output intensity after setting or changing, and the luminance of the illumination unit is able to be more precisely controlled.

In a modification of the first aspect, for example,
the first control unit may store an assumed temperature of the light source unit associated with the control value, and
the first control unit may determine the correction value based on: the difference between the target output intensity and the current output intensity; the current temperature; a first assumed temperature associated with the current control value; and a second assumed temperature associated with a target control value corresponding to the target output intensity.

In the modification of the first aspect, when, for example, determining the correction value with the control value associated with an assumed temperature of the light source unit, the current temperature of the light source unit, the current first assumed temperature or the first assumed temperature before changing, and a second assumed temperature after setting or changing may further be considered. Therefore, the current or the actual output intensity after driving more easily matches the target output intensity after setting or changing, and the luminance of the illumination unit is able to be more precisely controlled.

In a modification of the first aspect, for example,
the display device may further include a third circuit board on which the light source unit and the second detection unit are mounted.

In the modification of the first aspect, by, for example, mounting the illumination control unit which is a driver and the light source unit on separate circuit boards, it is possible to prevent heat from the illumination control unit from being transferred to the light source unit. Further, in the modification of the first aspect, by mounting the light source unit and the second detection unit (a detection unit that detects a current temperature of the light source unit) on the same circuit board, wiring between the light source unit and the second detection unit may be simplified.

In a modification of the first aspect, for example,
the display device may further include a second control unit that determines the target output intensity, and
the second control unit may further be mounted on the second circuit board.

In the modification of the first aspect, no defect will be caused in the display in the display element. Therefore, the illumination control unit and the second control unit may be mounted on the same circuit board.

In a modification of the first aspect, for example,
data representing the current temperature may flow in a wiring portion between the third circuit board and the second circuit board,
the data representing the current temperature and data representing the target output intensity may flow through a wiring portion between the first circuit board and the second circuit board,
the second control unit may transmit the target output intensity and the current temperature to the display control unit, and
the display control unit may transmit the target output intensity to the first control unit.

In the modification of the first aspect, the second control unit mounted on the second circuit board transmits the target output intensity to the first control unit via the display control unit mounted on the first circuit board. Further, in the modification of the first aspect, the second control unit transmits a current temperature of the light emitting unit to the display control unit. Therefore, in the modification of the first aspect, it is not necessary to provide a direct wiring portion between the second detection unit (a detection unit that detects a current temperature of the light source unit) mounted on the third circuit board and the display control unit mounted on the first circuit board. Therefore, when assembling the display device with the first circuit board, the second circuit board, and the third circuit board being fixed, workability is improved.

It should be readily appreciated by those skilled in the art that the exemplified aspects according to the present invention may further be modified without departing from the spirit of the present invention.

BRIEF DESCRIPTION OF THE DRAWINGS

FIG. 9(A) to FIG. 9(F) are an explanatory diagram of a method for driving a display element 30 and a light emitting unit 10 in FIG. 3.

MODE FOR CARRYING OUT THE INVENTION

The best mode described below will be provided for easy understanding of the present invention. Therefore, those skilled in the art should note that the present invention is not unduly limited by the embodiments described below.

Figure 1:
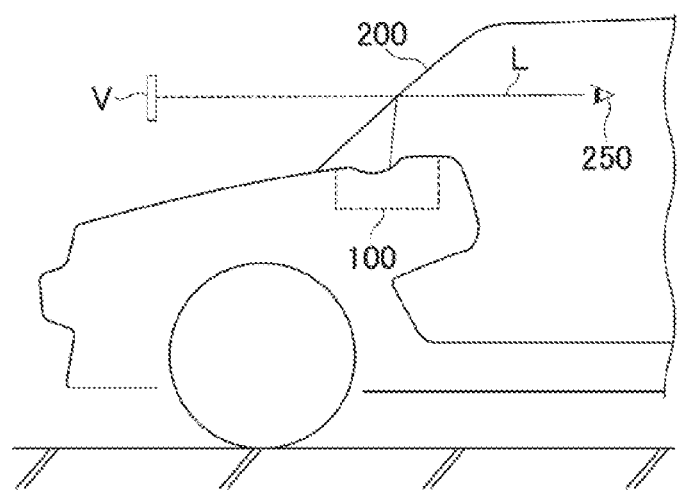
FIG. 1 is an explanatory diagram of an application of a display device according to the present invention.

FIG. 1 is an explanatory diagram of an application of a display device according to the present invention. In the example of FIG. 1, a head-up display device 100 is illustrated as a display device, for example, and the head-up display device 100 is applicable to a vehicle, such as a car. The head-up display device 100 is provided in a dashboard of the vehicle. The head-up display device 100 reflects display light L representing a display image on a windshield 200, so that a vehicle occupant, such as a driver 250, is able to visually recognize a virtual image V of the display image representing, for example, vehicle information.

Figure 2:
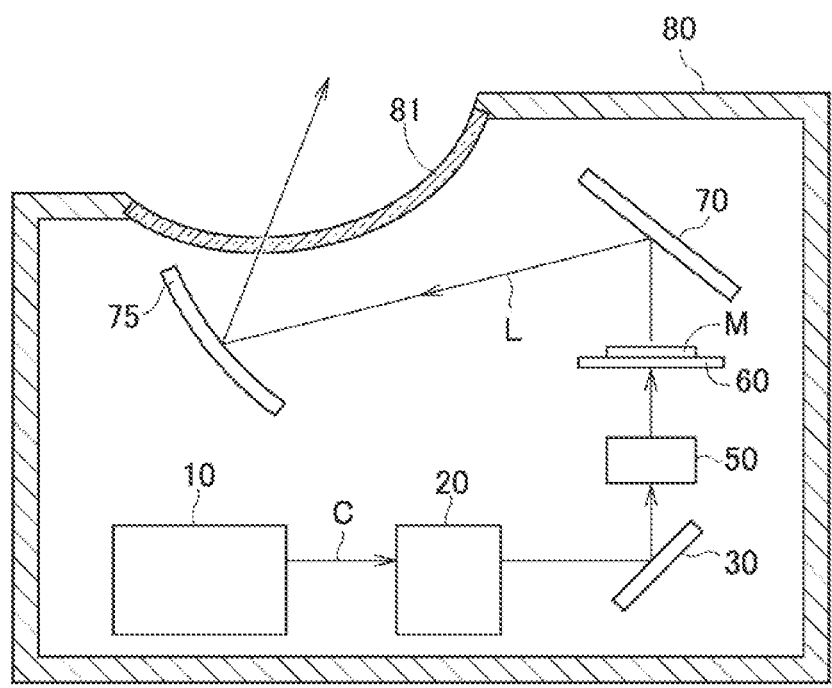
FIG. 2 is an explanatory diagram of a display mechanism of a head-up display device in FIG. 1.

FIG. 2 is an explanatory diagram of a display mechanism of the head-up display device 100 in FIG. 1. In the example of FIG. 2, the head-up display device 100 includes, for example, an illumination unit 10, an illumination optical system 20, a display element 30, a detection unit 40 (see FIG. 3(A)), a projection optical system 50, a screen 60, a planar mirror 70, a concave mirror 75, and a housing 80 having a window portion 81 through which a display image M exits.

Figure 3A:
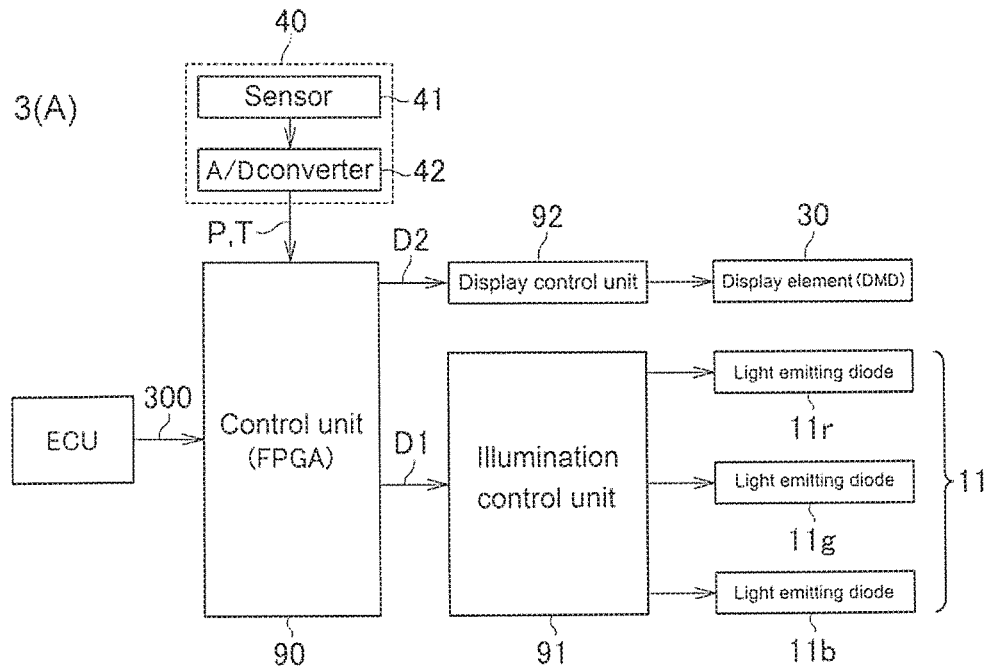
FIG. 3(A) illustrates a configuration example of the display device according to the present invention.
Figure 3B:
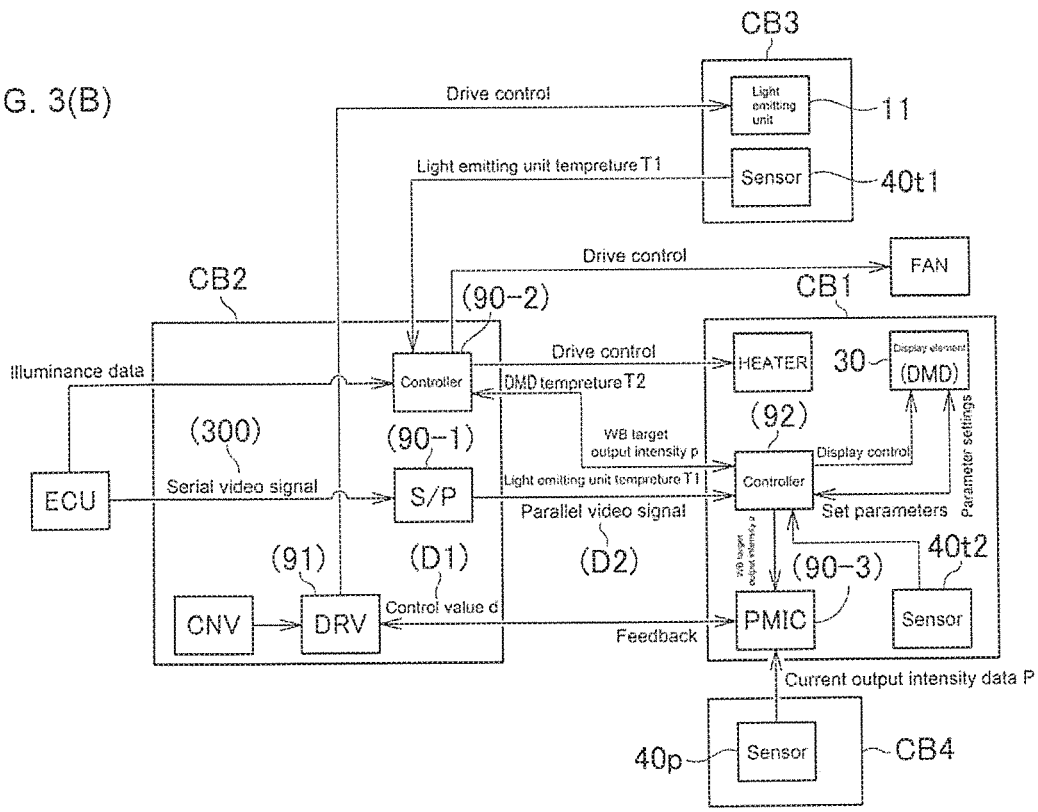
FIG. 3(B) illustrates an example of arrangement of circuit components on each of a plurality of circuit boards that form the display device in FIG. 3(A).

The illumination unit 10 in FIG. 2 includes a light source unit 11 (see FIG. 3(B)) capable of emitting light, and may further include, for example, a circuit board (a third circuit board CB3) on which the light source unit 11 is mounted, a reflective transmission optical unit (not illustrated), and a luminance unevenness reducing optical unit (not illustrated). The light source unit 11 includes a light emitting diode 11*r* that emits, for example, red light (in a broad sense, a first light emitting device), a light emitting diode 11*g* that emits, for example, green light (in a broad sense, a second light emitting device), and a light emitting diode 11*b* that emits, for example, blue light (in a broad sense, a third light emitting device) (see FIG. 3(A)).

When the light source unit 11 is formed by, for example, the first to the third light emitting devices, the third circuit board CB3 in FIG. 3(B), for example, is formed by three circuit boards, and in an example, a single light emitting unit 11 and a single sensor 40*t*1 (a temperature detection sensor) may be mounted on each circuit board CB3. That is, the light emitting unit 11 may be formed by a single single-color light emitting device. FIG. 3(B) conceptually illustrates at least one third circuit board CB3.

The illumination optical system 20 in FIG. 2 is formed by a concave lens or the like, for example, and is able to adjust illumination light C emitted from the illumination unit 10 to a size of the display element 30. The display element 30 in FIG. 2 is, for example, a DMD (Digital Micro-mirror Device) provided with a plurality of movable micromirrors. Each of the plurality of micromirrors is individually controlled. When the micromirror is ON, the micromirror is inclined, for example, +12 degrees around a hinge (not illustrated) and is able to reflect, toward the projection optical system 50, the illumination light C emitted from the illumination optical system 20. When the micromirror is OFF, the micromirror is inclined, for example, by −12 degrees around the hinge, and is not able to reflect the illumination light C toward the projection optical system 50.

The detection unit 40 in FIG. 3(A) is able to detect output intensity of the light source unit 11 of the illumination unit 10, and desirably is able to also detect a temperature of the light source unit 11, and more desirably is able to also detect a temperature of the display element 30. That is, the detection unit 40 in FIG. 3(A) desirably includes, for example, a sensor 40*p* (an output intensity sensor) in FIG. 3(B) and a sensor 40*t*1 (a temperature detection sensor). More desirably, the detection unit 40 includes, for example, the sensor 40*p*, the sensor 40*t*1, and a sensor 40*t*2 (a temperature detection sensor). The projection optical system 50 in FIG. 2 is formed by, for example, a concave lens or a convex lens, or the like, and is able to efficiently illuminate the screen 60 with the display light L of the display image M projected from the display element 30. The screen 60 in FIG. 2 is formed by, for example, a diffusion plate, a holographic diffuser, a microlens array, or the like. The screen 60 is able to receive the display light L from the projection optical system 50 on a lower surface thereof, and display the display image M on an upper surface thereof.

The planar mirror 70 in FIG. 2 is able to reflect the display image M displayed on the screen 60 toward the concave mirror 75. The concave mirror 75 in FIG. 2 is, for example, a concave mirror or the like, reflects the display light L from the planar mirror 70 on a concave surface, and the reflected light is directed toward the window portion 81. The display light L reaches the driver 250 in FIG. 1 via such a display mechanism, and the virtual image V recognized by the driver 250 has a dimension increased from that of the display image M displayed on the screen 60.

A material of the housing 80 in FIG. 2 is, for example, hard resin or the like, and the window portion 81 having a predetermined size is provided in an upper part of the housing 80. A material of the window portion 81 in FIG. 2 is translucent resin such as acrylic resin, for example, and the window portion 81 has, for example, a curved shape. The window portion 81 is able to transmit the display light L from the concave mirror 75.

FIG. 3(A) illustrates a configuration example of a display device according to the present invention, and FIG. 3(B) illustrates an example of arrangement of circuit components on each of a plurality of circuit boards CB1, CB2, CB3 and CB4 that form the display device in FIG. 3(A). In FIG. 1, the display device is illustrated as the head-up display device 100, and the head-up display device 100 is controlled by, for example, a control unit 90, an illumination control unit 91, and a display control unit 92 in FIG. 3(A). In the example of FIG. 3(A), an ECU (Electronic Control Unit) generates a video signal 300, and the control unit 90 is able to input the video signal 300 in the communication standard of, for example, the LVDS (Low-Voltage Differential Signaling). The control unit 90 is typically configured by, for example, an FPGA (Field Programmable Gate Array), but may also be configured by an ASIC (Application Specific Integrated Circuit), a microcomputer, or the like. Further, the control unit 90, the illumination control unit 91, and the display control unit 92 may be configured by, for example, integrated ICs.

The control unit 90 in FIG. 3(A) is able to output, to the illumination control unit 91, illumination control data D1 for controlling the illumination unit 10 at the luminance and light emission timing required by the video signal 300, and output, to the display control unit 92, display control data D2 for forming the display image M required by the video signal 300 in the display element 30. A frame F, which is a period of displaying the display image M, is formed by subframes SF divided into a plurality of time periods (see FIG. 9). The illumination control unit 91 in FIG. 3(A) is able to control the illumination unit 10 in the field sequential driving format that sequentially switches the light emitting diodes 11$r$, 11$g$, and 11$b$ of a color different for each subframe SF at high speeds with light intensity and timing required by the illumination control data D1.

The display control unit 92 in FIG. 3(A) performs ON/OFF control of an individual micromirror of the display element 30 by, for example, PWM based on the display control data D2, uses the light emitting diodes 11$r$, 11$g$, and 11$b$ as basic colors when reflecting the illumination light C emitted from the illumination unit 10 toward the screen 60, so that the display image M can be expressed as a color mixed image or a full color image by additive mixing. The detection unit 40 in FIG. 3(A) (specifically, the sensor 40$p$ (the first detection unit)) includes, for example, a sensor 41 which is a photodiode, and an A/D converter 42 that converts analog data to digital data. The detection unit 40 is able to output intensity data P of the light emitting unit 11 to the control unit 90. The detection unit 40 (specifically, the sensor 40$p$) is provided for each of the light emitting diodes 11$r$, 11$g$, and 11$b$, and the sensor 41 is typically able to include three light intensity detection sensors.

Desirably, the detection unit 40 (specifically, the sensor 40$t1$ (the second detection unit)) in FIG. 3(A) also outputs temperature data T of the light emitting unit 11 to the control unit 90, and the sensor 41 is typical able to further include three temperature detection sensors corresponding to the three light emitting diodes 11$r$, 11$g$, and 11$b$. Temperature data T1 of the light emitting unit 11 is, for example, an ambient temperature of the light emitting diode or an LED chip. The control unit 90 may calculate a junction temperature based on an ambient temperature thereof, thermal resistance from an LED chip to a surrounding atmosphere, and input power.

More desirably, the detection unit 40 (more specifically, the sensor 40$t2$ (a third detection unit)) in FIG. 3(A) is able to further output, to the control unit 90, temperature data T2 of the display element 30 which is, for example, a DMD, and the sensor 41 is able to further include a single temperature detection sensor corresponding to the display element 30.

In the example of FIG. 3(B), a third control unit 90-1 (specifically, a serial/parallel (S/P) converter) controls the display control unit 92 (specifically, the controller (a DMD controller)) by using the display control data D2 (specifically, a parallel video signal) based on the video signal 300 (specifically, a serial video signal). A first control unit 90-3 (specifically, a power management IC (PMIC)) controls the illumination control unit 91 (specifically, a driver DRV (an LED driver)) by using the illumination control data D1 (specifically, a control value d) based on the video signal 300 (specifically, the display control data D2). A second control unit 90-2 (specifically, a controller (a microcontroller)) is able to determine target output intensity data p of the light emitting unit 11 based on, for example, illuminance data, and is able to relay the temperature data T1.

Note that the serial/parallel (S/P) converter is a video signal input unit in a broad sense, and the third control unit 90-1 or the video signal input unit may input the parallel video signal from the ECU, and transmit the input parallel video signal to the display control unit 92 (the DMD controller). Alternatively, the third control unit 90-1 may be omitted and the display control unit 92 (the DMD controller) may input the parallel video signal from the ECU, and the display control unit 92 (the DMD controller) may have a function of the video signal input unit of the control unit 90.

The display element 30 (the DMD) and the display control unit 92 (the DMD controller) are mounted on a first circuit board CB1 in FIG. 3(B). Further, the illumination control unit 91 (the LED driver) and the third control unit 90-1 (the S/P) are mounted on a second circuit board CB2. In this example, the display element 30 capable of forming the display image M is mounted on the first circuit board CB1, while the illumination control unit 91 that controls the illumination unit 10 including the light source unit 11 capable of emitting light is mounted on the second circuit board CB2. Since the illumination control unit 91 controls the illumination unit 10 including the light source unit 11, a heat generation amount of the illumination control unit 91 to cause the illumination unit 10 (the light source unit 11) to emit light typically increases. Also, the present inventors have recognized that display quality in the display element 30 depends on the temperature (T2) of the display element 30. That is, in order to stabilize an operation of the display element 30, the present inventors have mounted the illumination control unit 91 and the display element 30 on separate circuit boards to prevent the heat from the illumination control unit 91 from being transferred to the display element 30.

In particular, the present inventors have recognized that when the display element 30 is a DMD, defects may be caused in the display in the DMD at high temperatures (e.g., 90 degrees Celsius or higher).

Since the third control unit 90-1 converts a serial video signal to a parallel video signal, third control unit 90-1 is more resistant to temperature than the display element 30 is. By mounting the illumination control unit 91 and the third control unit 90-1 on the same circuit board, it is possible to suppress an increase in size of the head-up display device 100. Alternatively, since no defects will be caused in the display in the display element 30, the illumination control unit 91 and the third control unit 90-1 can be mounted on the same circuit board. Note that when the third control unit 90-1 is a video signal input unit that inputs a parallel video signal from the ECU, the video signal input unit (the third control unit 90-1) is more resistant to temperature than the display element 30 is.

Since the display control unit 92 controls the display element 30, wiring between the display element 30 and the display control unit 92 is able to be simplified by mounting the display element 30 and the display control unit 92 on the same circuit board. Alternatively, by mounting the display element 30 and the display control unit 92 on the same circuit board, it is possible to efficiently connect the display element 30 and the display control unit 92 electrically.

In the example of FIG. 3(B), the illumination control unit 91 is an LED driver, for example. The illumination control unit 91 consumes an electric current to drive the light source unit 11 and therefore easily generates heat. Note that the illumination control unit 91 may further include a driver driving power supply unit (specifically, a DC/DC converter CNV) that supplies power for driving the LED driver. When the illumination control unit 91 is, for example, an LED driver and a driver drive power supply unit, the driver drive power supply unit is also a source of power for driving the LED driver, and therefore the driver driving power supply unit easily generates heat. As an example, the DC/DC converter CNV is able to transform or step down a battery power supply (e.g., 12 V) to a voltage driven by the LED driver (e.g., 8 V).

In the example of FIG. 3(B), the first control unit 90-3 may further be mounted on the first circuit board CB1. The first control unit 90-3 generates the illumination control data D1 (specifically, the control value d) based on the parallel video signal (in a broad sense, the video signal 300). Therefore, by, for example, mounting the illumination control unit 91 which is the LED driver and the first control unit 90-3 on separate circuit boards, it is possible to prevent heat from the illumination control unit 91 from being transferred to the first control unit 90-3. Further, by mounting the display control unit 92 and the first control unit 90-3 on the same circuit board, it is possible to simplify the wiring between the display control unit 92 and the first control unit 90-3.

In the example of FIG. 3(B), the second control unit 90-2 mounted on the second circuit board CB2 transmits target output intensity p to the first control unit 90-3 via the display control unit 92 mounted on the first circuit board CB1. Further, the third control unit 90-3 transmits a current temperature (T1) of the light emitting unit 11 to the display control unit 92. Therefore, in the head-up display device 100, it is not necessary to provide a direct wiring portion between the second detection unit (the sensor 40t1 that detects the current temperature data T1 of the light source unit 11) mounted on the third circuit board CB3 and the display control unit 92 mounted on the first circuit board CB1. Therefore, when assembling the head-up display device 100 by with the first circuit board CB1, the second circuit board CB2, and the third circuit board CB3 being fixed, workability is improved.

On the fourth circuit board CB4 in FIG. 3(B), the first detection unit (the sensor 40p that detects the output intensity data P of the light emitting unit 11) is mounted. On the first circuit board CB1, the third detection unit (the sensor 40t2 that detects the current temperature data T2 of the display element 30) is mounted. When the display element 30 is a DMD, because a DMD is less resistant to temperature, a heater, for example, is further mounted on the first circuit board CB1, and the display control unit 92 is able to, for example, relay the temperature data T2. When, for example, the temperature data T2 becomes lower than a lower limit of a predetermined temperature range of the DMD, the second control unit 90-2 is able to increase the temperature of the DMD with the heater based on the temperature data T2. Alternatively, when, for example, the temperature data T2 becomes higher than an upper limit of the predetermined temperature range of the DMD, the second control unit 90-2 is able to lower the temperature of the DMD with a fan based on the temperature data T2.

The display control unit 92 is able to control each of a plurality of micromirrors that form the DMD (the display element 30) in a high-speed signal path based on the parallel video signal. Further, the display control unit 92 is able to perform or change setting of the display element 30 via a low-speed signal path and read a set value from the display element 30. Further, the display control unit 92 is able to calculate, for example, white balance information WH suitable for the temperature data T1 of the light emitting unit 11.

Based on a difference between the target output intensity P of the light emitting unit 11 and the current output intensity p and the white balance information WH (in a broad sense, the temperature data T1), the first control unit 90-3 is able to determine a correction value of a control value corresponding to the target output intensity P of the light source unit 11, and output the corrected control value d to the illumination control unit 91. The current value, for example, of the light emitting unit 11 driven by the illumination control unit 91, which is an LED driver, for example, is fed back to the first control unit 90-3, and the first control unit 90-3 is able to determine or adjust the control value based on the feedback.

Figure 4A:
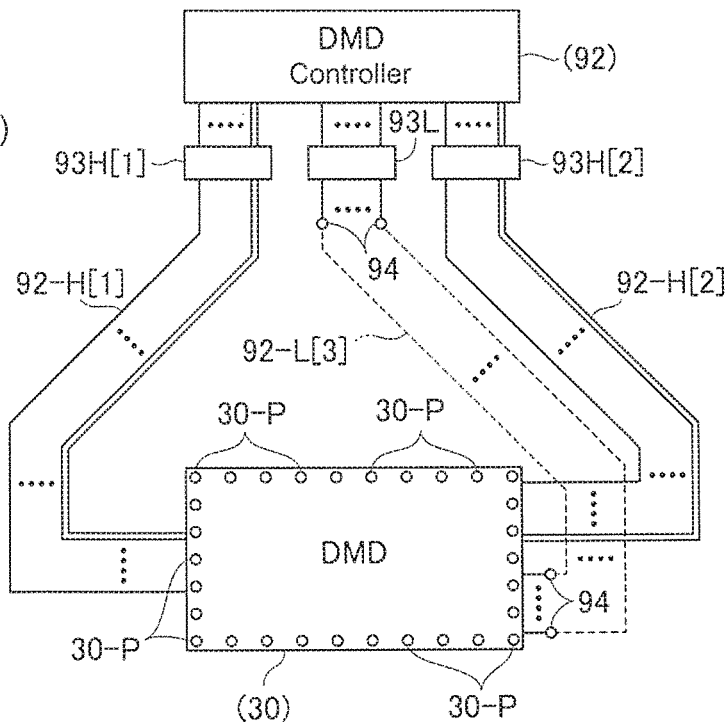
FIGS. 4(A) and 4(B) each illustrates an example of arrangement of a DMD controller and a DMD mounted on a front surface of a first circuit board in FIG. 3(B), and an example of wiring therebetween.
Figure 4B:
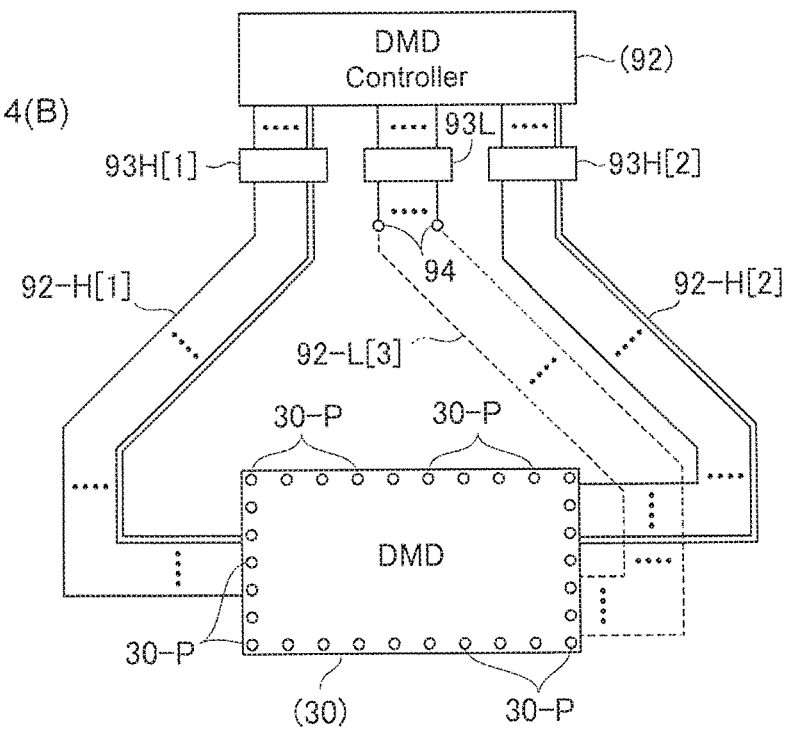

FIGS. 4(A) and 4(B) each illustrates an example of arrangement of a DMD controller (in a broad sense, the display control unit 92) mounted on a front surface of the first circuit board CB1 in FIG. 3(B) and a DMD (in a broad sense, the display element 30), and an example of wiring therebetween. In the example of FIG. 4(A), the DMD controller receives a parallel video signal from the serial/parallel converter (the third control unit 90-1), transmits a control signal (the first signal) for controlling ON/OFF of a plurality of mirrors that form the DMD to the DMD, and transmits a setting signal (the second signal) for setting control of the plurality of mirrors to the DMD.

The parallel video signal is a communication signal between the serial/parallel converter and the DMD controller, and the parallel video signal conforms to, for example, Open LDI (open LVDS display interface) standard which is a general-purpose communication standard. That is, the parallel video signal needs to match an input format of the DMD controller. When the DMD controller is suitable, for example, for an in-vehicle head-up display, the parallel video signal is typically transmitted through a link (in a broad sense, a wiring cable transmitting a differential signal) conforming to the LVDS standard of, for example, 5 pairs (10 lines) formed by 1 clock (Clock*1) and 4 data (Data*4) at, for example, a transmission rate in a range of 300 Mbps to 400 Mbps, (=a second transmission rate).

The parallel video signal is converted from a serial video signal. The serial video signal is a communication signal between the ECU and the serial/parallel converter. The serial video signal is transmitted through a wiring cable conforming to a 1-line high-speed interface at, for example, a transmission rate in a range of, for example, 1 Gbps to, for example, 2 Gbps (=a first transmission rate>the second transmission rate).

A control signal (a first signal) for controlling ON/OFF of a plurality of mirrors that form the DMD (e.g., resolution: 1152*1152) is a communication signal between the DMD controller and the DMD. Specifically, the control signal is transmitted on two links (36 lines in total) at a transmission rate of about, for example, 600 Mbps×2(=1.2 Gbps, for example) (=a third transmission rate>the first transmission rate). The links are: a first link conforming to the LVDS standard of nine pairs (18 lines) formed by 1 clock (Clock*1) and 8 data (Data*8) (in a broad sense, the first circuit wiring 92-H[1] through which the first differential signal is transmitted (e.g., illustrated by only three lines in FIG. 4(A), and illustration of the remaining 15 lines, for example, is simplified or omitted)), and a second link conforming to the LVDS standard of nine pairs (18 lines) formed by 1 clock (Clock*1) and 8 data (Data*8) (in a broad sense, the second circuit wiring 92-H[2] through which the first differential signal is transmitted (e.g., illustrated by only three lines in FIG. 4(A), and illustration of the remaining 15 lines, for example, is simplified or omitted)).

The setting signal (the second signal) for setting control of a plurality of mirrors is also a communication signal between the DMD controller and the DMD. The setting signal is typically transmitted, for example, on a link conforming to the LVDS standard of two pairs (four lines) formed by 1 clock (Clock*1) and 1 data (Data*1) (in a broad sense, the third circuit wiring 92-H[3] through which the second differential signal is transmitted (e.g., illustrated by only two lines in FIG. 4(A), and illustration of the remaining lines is simplified or omitted)) at about, for example, a transmission rate of about 120 Mbps (=a fourth transmission rate<the first transmission rate<the third transmission rate).

The third circuit wiring 92-L[3] in FIG. 4(A) may further include, for example, two lines in a single end format (of which illustration is simplified or omitted in, for example, FIG. 4(A)). A refresh rate, for example, of the DMD is written from the DMD controller to the DMD by an LVDS signal (e.g., two pairs (four lines)). A refresh rate, for example, currently set in the DMD is read out from the DMD to the DMD controller by a single end signal (e.g., two lines). The setting signal (the second signal) may include not only the refresh rate but also other parameters for determining ON/OFF of each mirror, such as vertical inversion of the display image M, for example.

In the example of FIG. 4(A), the DMD is able to turn ON and OFF each of the plurality of mirrors that form the DMD based on the control signal and the setting signal from the DMD controller, and the DMD and the DMD controller are mounted on a front surface of the first circuit board CB1 in FIG. 3(B). Note that the DMD and the DMD controller may be mounted not on the front surface of the first circuit board CB1 but on a back surface of the first circuit board CB1. That is, the DMD and the DMD controller are mounted on the same surface of the first circuit board.

When the DMD and the DMD controller are mounted on the front surface of the first circuit board CB1, the first circuit wiring 92-H[1] and the second circuit wiring 92-H[2] (in a broad sense, the first wiring on the front surface of the first circuit board CB1) for transmitting the control signal are mounted on the front surface of the first circuit board CB1 and are not mounted on the back surface of the first circuit board CB1. Since the control signal determines ON/OFF of each of the plurality of mirrors (e.g., resolution: 1152*1152) forming the DMD, the amount of information is large and therefore the first circuit wiring 92-H[1] and the second circuit wiring 92-H[2] are desirably arranged on the same surface (e.g., the front surface) of the first circuit board CB1.

Therefore, the control signals transmitted through the first circuit wiring 92-H[1] and the second circuit wiring 92-H[2] are not bypassed to the other surface (e.g., the back surface) of the first circuit board CB1, and is not connected to a first via portion 94 (illustrated as only two vias in, for example, FIG. 4(A) and illustration of the remaining, for example, four vias is simplified or omitted). Since ON/OFF control of the DMD mirror is related directly to display quality of the display image M, display quality of the display image M is able to be improved by disposing the first circuit wiring 92-H[1] and the second circuit wiring 92-H[2] with priority.

Figure 5A:
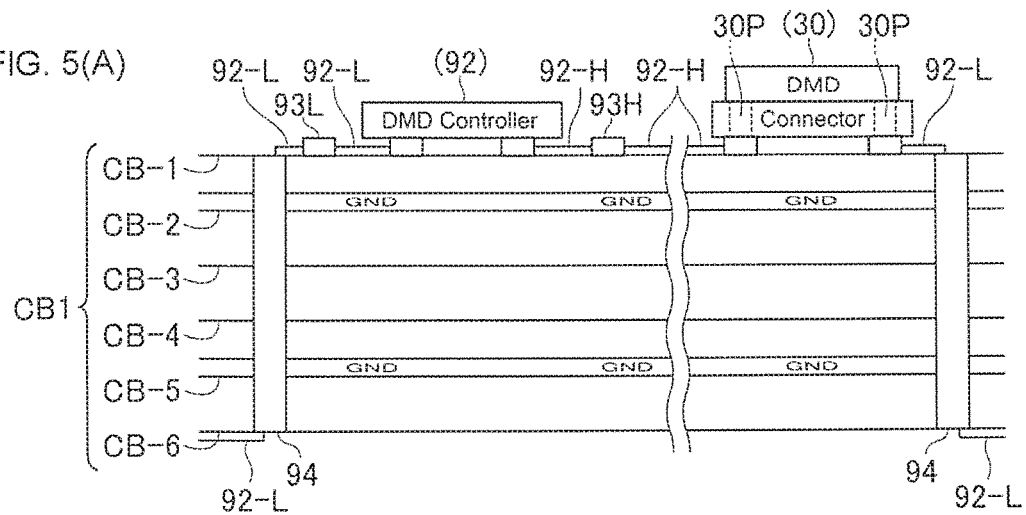
FIGS. 5(A) and 5(B) each is a schematic explanatory diagram of a route of wiring arranged on a multilayer circuit board that forms the first circuit board in FIGS. 4(A) and 4(B).

In the example of FIG. 4(A), the first circuit board CB1 is a multilayer circuit board (see, for example, FIG. 5(A)) having the first via portion 94 (on the DMD controller side) that electrically connects the front surface and the back surface of the first circuit board CB. The first circuit board CB1 in FIG. 4(A) further includes a second via portion 94 (on the DMD side) (illustrated as only two vias in, for example, FIG. 4(A) and illustration of the remaining, for example, four vias is simplified or omitted).

When the DMD and the DMD controller are mounted on the front surface of the first circuit board CB1, in the example of FIG. 4(A), the third circuit wiring 92-L[3] that transmits the setting signal includes: a first portion that connects the DMD controller and the first via portion 94 (the DMD controller side), the first portion being disposed only on the front surface of the first circuit board CB1; and a second portion disposed only on the back surface of the first circuit board CB1, the second portion extending from the first via portion 94 (on the DMD controller side) toward the DMD (illustrated only by two dotted lines in FIG. 4(A), and illustration of the remaining lines is simplified or omitted.)

Specifically, the second portion of the third circuit wiring 92-L[3] connects the first via portion 94 (the DMD controller side) and the first via portion 94 (the DMD side). In the example of FIG. 4(A), the third circuit wiring 92-L[3] may further include a third portion that connects the first via portion 94 (the DMD side) and the DMD. The third portion is disposed only on the front surface of the circuit board CB1.

Note that in the example of FIG. 4(B), the first circuit board CB1 in FIG. 3(B) does not include the second via portion 94 (the DMD side) and, therefore, the third circuit wiring 92-L[3] does not include the third portion in FIG. 4(A). Specifically, in the example of FIG. 4(B), the third circuit wiring 92-L[3] includes the same first portion as the first portion in FIG. 4(A), and the second portion in FIG. 4(B) directly connects the first via portion 94 (the DMD controller side) and the DMD on the back surface of the first circuit board CB1.

In the example of FIG. 4(A), the first circuit wiring 92-H[1] and the second circuit wiring 92-H[2] include first signal quality adjustment elements 93H[1] and 93H[2]. The first signal quality adjustment elements 93H[1] and 93H[2] are noise filters, and more specifically are common mode filters (common mode noise filters).

When the common mode filter is, for example, a common mode choke coil, a single common mode choke coil is disposed on each line. In FIG. 4(A), the first signal quality adjustment element 93H[1] represents an area in which it is to be disposed, that is, the first signal quality adjustment element is illustrated as a functional block. Specifically, when the first circuit wiring 92-H[1] is, for example, nine pairs of first differential signal lines (18 lines), illustration of specific arrangement of, for example, 18 common mode choke coils is omitted, or simplified by the arrangement area denoted by the reference numeral 93H[1]. Similarly, when the second circuit wiring 92-H[2] is, for example, nine pairs of first differential signal lines (18 lines), illustration of specific arrangement of, for example, 18 common mode choke coils is omitted, or simplified by the arrangement area denoted by the reference numeral 93H[2].

The first signal quality adjustment elements 93H[1] and 93H[2] that adjust a waveform of the first differential signal are desirably disposed on the side of the DMD controller, and a distance between each of the first signal quality adjustment elements 93H[1] and 93H[2] and the DMD controller is desirably shorter than a distance between each of the first signal quality adjustment elements 93H[1] and 93H[2] and the DMD. When the first signal quality adjustment elements 93H[1] and 93H[2] are positioned close to the DMD controller, the first signal (the control signal for controlling ON and OFF of a plurality of mirrors (e.g., resolution: 1152*1152) that form the DMD) formed by the first differential signal immediately reaches the first signal quality adjustment elements 93H[1] and 93H[2] after being transmitted from the DMD controller. Thereafter, it is possible to prevent deterioration of the first signal (the control signal) before reaching the DMD.

In the example of FIG. 4(A), the third circuit wiring 92-L[3] includes a second signal quality adjustment element 93L. The second signal quality adjustment element 93L is a noise filter, and more specifically is a common mode filter (a common mode noise filter). When the third circuit wiring 92-L[3] is, for example, two pairs of second differential signal lines (four lines), illustration of, for example, specific arrangement of four common mode choke coils is omitted, or simplified by an arrangement area denoted by the reference numeral 92-L[3].

The second signal quality adjustment element 93L that adjusts a waveform of the second differential signal is desirably disposed on the side of the DMD controller, and a distance between the second signal quality adjustment element 93L and the DMD controller is desirably shorter than a distance between the second signal quality adjustment element 93L and a front DMD. Note that the second signal quality adjustment element 93L is formed inside the first portion of the third circuit wiring 92-L[3] disposed, for example, only on the front surface of the first circuit board CB1. When the second signal quality adjustment element 93L is positioned close to the DMD controller, the second signal (the setting signal for setting control of the plurality of mirrors) formed by the second differential signal immediately reaches the second signal quality adjustment element 93L after being transmitted from the DMD controller. Thereafter, it is possible to prevent deterioration of the second signal (the setting signal) before reaching the DMD.

Figure 5B:
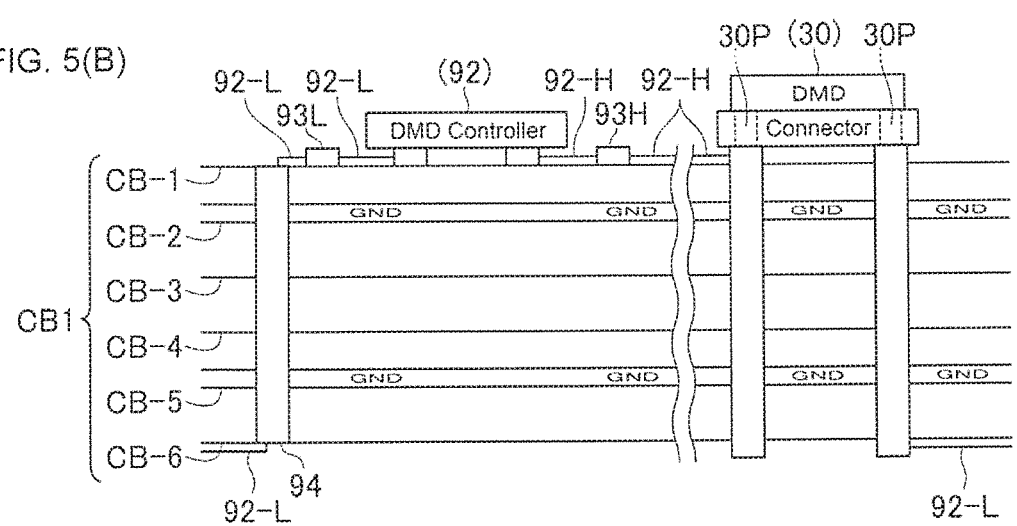

FIGS. 5(A) and 5(B) each is a schematic explanatory diagram of a route of wiring 92-H and 92-L arranged on a multilayer circuit board that forms the first circuit board CB1 (see FIG. 3(B)) in FIGS. 4(A) and 4(B). Note that FIGS. 5(A) and 5(B) do not accurately illustrate specific cross sections of FIGS. 4(A) and 4(B) and are provided for those skilled in the art to easily understand the wiring from the DMD controller to the DMD.

In the example of FIG. 5(A), the first circuit board CB1 is, for example, a six-layer circuit board. However, the present invention is not limited to the example of FIG. 5(A). That is, the first circuit board CB1 in FIG. 3(B) is a multilayer circuit board, which, as illustrated in FIG. 5(A), desirably includes a first ground layer that forms a layer CB-2 and a second ground layer that forms a layer CB-5. Layers CB-3 and CB-4 (intermediate layers (e.g., power supply layers)) are, for example, optional layers, which may be omitted. That is, the first circuit board CB1 may be, for example, a four-layer circuit board that desirably includes the first and the second ground layers. Alternatively, the first circuit board CB1 may be, for example, a seven or more layer circuit board including the first and the second ground layers and unillustrated other layers.

In the example of FIG. 5(A), wiring 92-H (corresponding to first circuit wiring 92-H[1] and second circuit wiring 92-H[2] in FIG. 4(A)) is formed on a layer CB-1 (a first layer that forms a front surface of the first circuit board CB1) and the signal quality adjustment element 93H (corresponding to the first signal quality adjustment elements 93H[1] and 93H[2] in FIG. 4(A)) is included between the DMD controller and the DMD.

In the example of FIG. 5(A), the DMD is mounted on the front surface of the first circuit board CB1 via a surface mount type connector (socket). Specifically, the DMD controller and the connector (the socket) are surface-mounted on the front surface of the first circuit board CB1, and pins 30-P (terminals) of the DMD (only 30 pins 30-P are illustrated in, for example, FIG. 4(A) and illustration of other pins is omitted)) enters into a connecting portion 30P of the connector (the socket), whereby the DMD controller and the DMD are electrically connected.

In the example of FIG. 5(A), the first circuit board CB1 further includes a layer CB-2 (a second layer) positioned immediately below the layer CB-1 (the first layer), and the layer CB-2 is typically a solid ground layer, for example. When the layer CB-2 is a solid ground layer (the first ground layer), a characteristic impedance of the wiring 92-H is easily modeled or calculated, and an impedance matching is easily performed with the connecting portion to the wiring 92-H (specifically, an output impedance of the DMD controller, which is a driver side of the LDVS and an input impedance of the DMD, which is a receiver side of the LDVS).

In the example of FIG. 5A, wiring 92-L (corresponding to the third circuit wiring 92-L[3] in FIG. 4(A)) includes a first portion formed on the layer CB-1 (the first layer that forms the front surface of the first circuit board CB1), and the first portion includes a signal quality adjustment element 93L (corresponding to the second signal quality adjustment element 93L in FIG. 4(A) between the DMD controller and the first via portion 94 (a through-hole via in FIG. 5(A)).

The wiring 92-L further includes a second portion, and the second portion connects the first via portion 94 and the second via portion 94 (the through hole via in FIG. 5(A)). The wiring 92-L is formed, for example, on a layer CB-6 (a fourth layer that forms the back surface of the first circuit board CB1) positioned immediately below the layer CB-5 (the third layer) which is a solid ground layer (the second ground layer). When the layer CB-5 is a solid ground layer (the second ground layer), a characteristic impedance of the second portion of the wiring 92-L (a main part which is the longest part of the wiring 92-L) is easily modeled or calculated, and an impedance matching is easily performed with the connecting portion to the wiring 92-L (specifically, an output impedance of the DMD controller, which is a driver side of the LDVS and an input impedance of the DMD, which is a receiver side of the LDVS).

In the example of FIG. 5(A), the wiring 92-L further includes a third portion, which connects the second via portion 94 and the DMD (a surface-mounting portion of the connector (the socket) in FIG. 5(A)).

In the example of FIG. 5(B), the wiring 92-L does not include the third portion of FIG. 5(B). Specifically, the connector (the socket) in FIG. 5(B) is an insertion type connector (socket) mounted on the first circuit board CB1 by, for example, through hole reflow. The second portion of the wiring 92-L connects the first via 94 and the pin of the insertion type connector (socket) on the back surface of the first circuit board CB1. It is not necessary that the first circuit board CB1 in FIG. 5(B) includes the second via portion 94 in FIG. 5(A) for connecting the second portion of the wiring 92-L on the back surface of the first circuit board CB1 and the DMD. Therefore, it is possible to prevent deterioration of the second signal (the setting signal for setting control of a plurality of mirrors).

Figure 6:
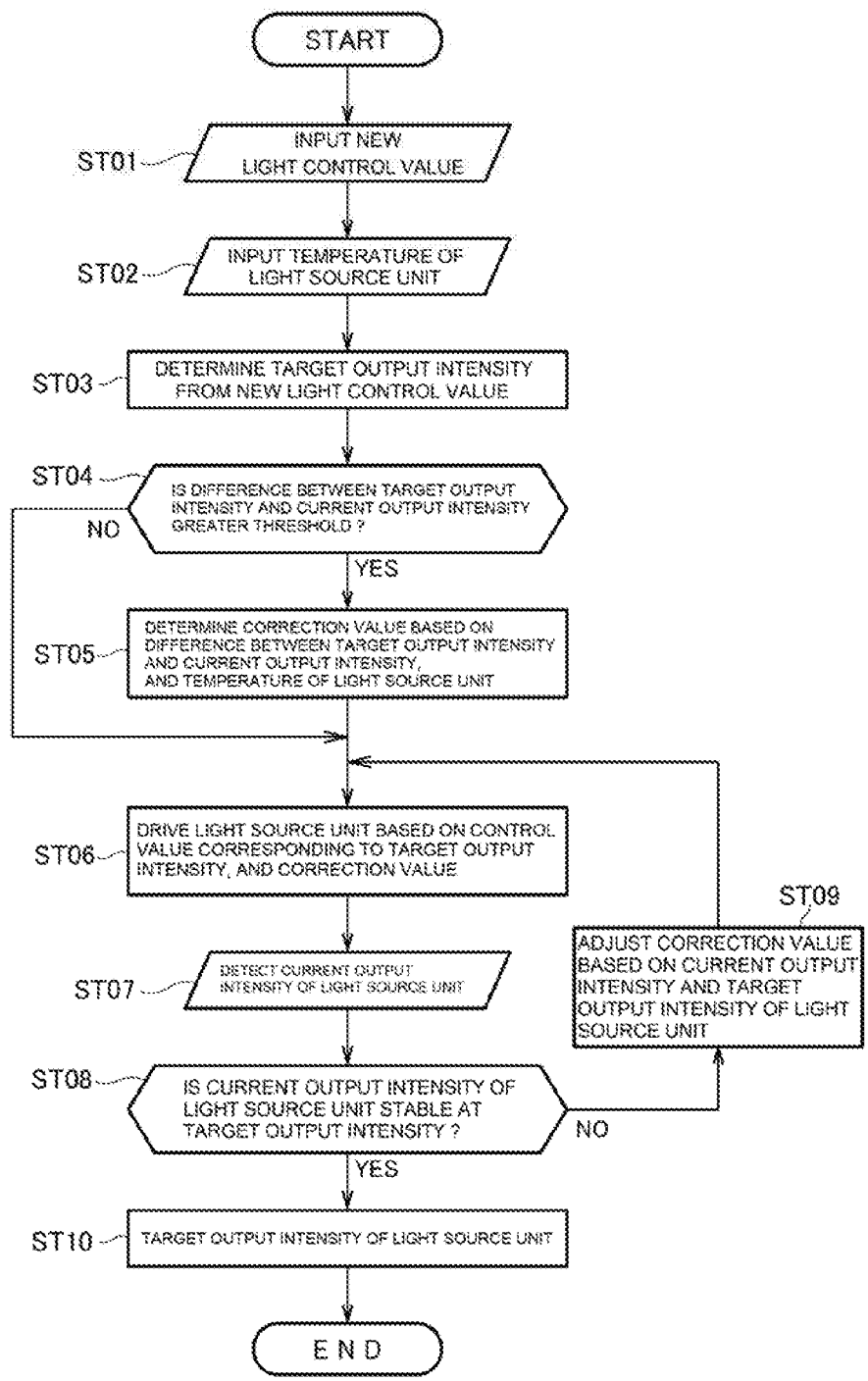
FIG. 6 is a flowchart illustrating an example of an operation of the display device in FIG. 3.

FIG. 6 is a flowchart illustrating an example of an operation of the display device in FIG. 3(A). For example, in step ST01, the control unit 90 (the second control unit 90-2 in FIG. 3(B)) inputs a new light control value. Typically, a vehicle or the head-up display device 100 in FIG. 1 includes an illuminance sensor that detects illuminance of external light, such as illuminance in front of the vehicle, and the control unit 90 is able to determine luminance of light required for the video signal 300 according to illuminance data. That is, a new light control value is typically illuminance data, for example. Alternatively, the new light control value may be determined by, for example, the ECU in FIG. 3(A) or unillustrated other ECU (in a broad sense, an in-vehicle device), or may be determined by an operation of the driver 250.

After the new light control value is input, the control unit 90 (the second control unit 90-2 in FIG. 3(B)) inputs the temperature of the light emitting unit 11 (e.g., the temperature of the light emitting diode 11r that emits red light) (step ST02 in FIG. 6). Next, the control unit 90 (the second control unit 90-2 in FIG. 3(B)) determines target output intensity (e.g., target light intensity of the light emitting diode 11r) of the light source unit 11 according to the new light control value (step ST03). Next, the control unit 90 (the first control unit 90-3 in FIG. 3(B)) determines whether a difference between the target output intensity set or changed based on the new light control value and current output intensity is equal to or greater than a threshold (a first threshold or intensity threshold) (step ST04).

When the difference between the target output intensity and the current output intensity is equal to or greater than the threshold, the control unit 90 (the first control unit 90-3 in FIG. 3(B)) determines a correction value based on the difference between the target output intensity and the current output intensity and the temperature of the light emitting unit 11 (step ST05). Note that when the display device or head-up display device 100 does not detect the temperature of the light emitting unit 11, step ST02 may be omitted, and in step ST05, the control unit 90 (the first control unit 90-3 in FIG. 3(B)) may determine the correction value based on the difference between the target output intensity and the current output intensity.

Figure 7:
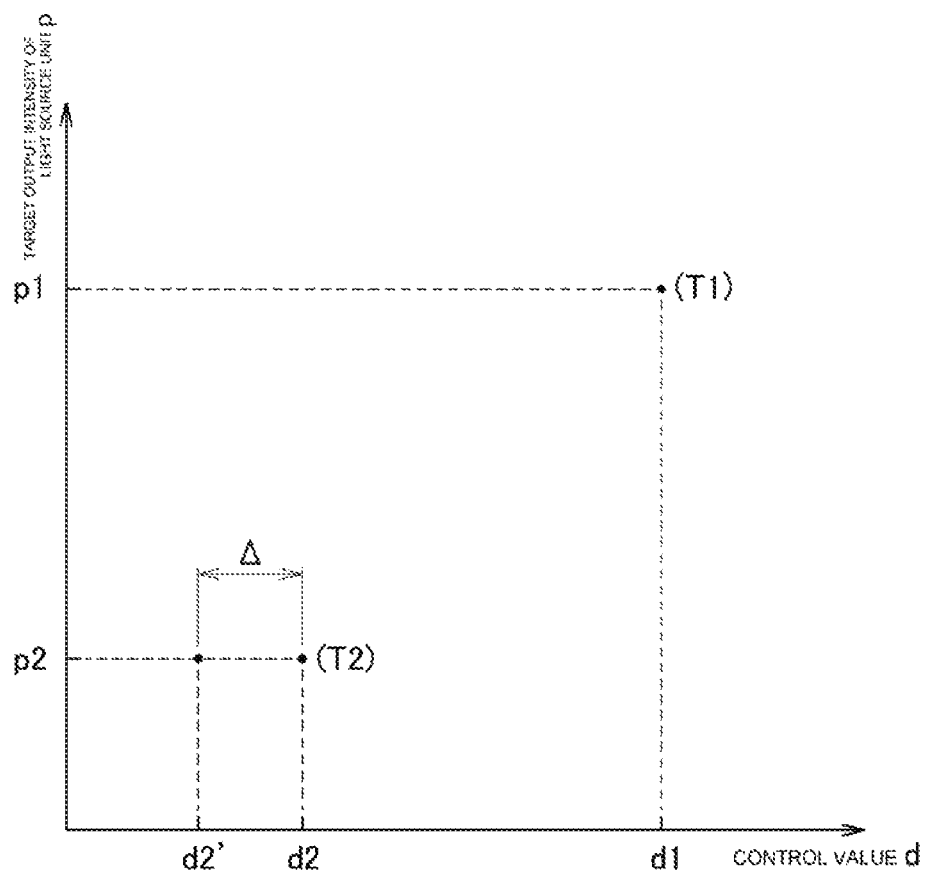
FIG. 7 is an explanatory diagram of a correction value used to correct a control value corresponding to target output intensity.

FIG. 7 is an explanatory diagram of a correction value used to correct a control value corresponding to target output intensity. the control unit 90 in FIG. 3 (the first control unit 90-3 in FIG. 3(B)) stores a control value corresponding to the target output intensity of the light source unit 11, and the control values corresponding to the target output intensities p1 and p2 are, for example, d1 and d2, respectively (see FIG. 7). A relational expression as illustrated in, for example, FIG. 7 is set at the time of manufacture in consideration of individual difference of the light emitting diodes 11r, 11g, and 11b. When the value of the target output intensity is to be changed from, for example, p1 to p2 in FIG. 7, the control unit 90 (the first control unit 90-3 in FIG. 3(B)) may consider the current output intensity (step ST05 in FIG. 6).

For example, it is assumed that the current output intensity data P of the light emitting diode 11r matches a target output intensity p1, and that the illumination control unit 91 drives the light emitting diode 11r with a control value d1. Specifically, the control unit 90 may consider a magnitude of a divergence between the current output intensity (=p1) and the target output intensity p2 after setting or changing. More specifically, when the illumination control unit 91 drives the light emitting diode 11r with a control value d2 corresponding to the target output intensity p2 after setting or changing, the control value d2 may be corrected with a correction value Δ based on a divergence from the current output intensity (=p1) to the target output intensity p2 (=p1−p2).

When the current output intensity (=p1) is lowered to the target output intensity p2 after setting or changing, the illumination control unit 91 is able to drive the light emitting diode 11r with a lowered control value (=d2−Δ=d2'). That is, the illumination control unit 91 is able to drive the light emitting diode 11r with the control corrected value d2' corresponding to the target output intensity lower than the target output intensity p2 after setting or changing. In general, as the target output intensity p becomes higher, the temperature of the light emitting diode 11r becomes higher. Therefore, the inventors have recognized that, when the current output intensity (=p1) is lowered to the target output intensity p2 after setting or changing, luminance of the light emitting diode 11r driven with the control value d2 is high due to a high temperature state of the light emitting diode 11r (a heat generation amount). In the illumination control unit 91 in FIG. 3, when the current output intensity (=p1) is lowered to the target output intensity p2 after setting or changing, the light source unit 11, such as the light emitting diode 11r is driven with the lowered control value (=d2−Δ=d2'). Therefore, the luminance of the illumination unit 10 can be precisely controlled.

Desirably, as the absolute value of the difference between the target output intensity and the current output intensity becomes higher, the absolute value of the correction value is set to be higher. That is, when the current output intensity (=p1) is lowered to the target output intensity after setting or changing (<p2), the illumination control unit 91 is able to drive the light emitting diode 11r with a further lowered control value (<d2'). As a divergence from the current output intensity to the target output intensity becomes wider, the illumination control unit 91 drives the light source unit 11 based on the correction value that has been corrected with strength according to the divergence. Therefore, the control unit 90 (the first control unit 90-3 in FIG. 3(B)) is able to control the luminance of the illumination unit 10 more precisely.

In FIG. 7, the control value d is electric power for driving the light emitting diode 11 based on a multiplication value of a duty cycle for PWM-driving a single light emitting device, such as the light emitting diode 11r, and a current value for PAM-driving the light emitting diode 11r. As an example, when the duty cycle for PWM-driving is constant, the control value d is a current for driving the light emitting diode 11. Alternatively, when the current for driving is constant, the control value d is the duty cycle for PWM driving.

For example, it is assumed that the current output intensity data P of the light emitting diode 11r matches a target output intensity p2, and that the illumination control unit 91 drives the light emitting diode 11r with a control value d2. When the current output intensity (=p2) is increased to the target output intensity p1 after setting or changing, the illumination control unit 91 is able to drive the light emitting diode 11r with the increased control value (>d1). More specifically, when the control unit 90 (the first control unit 90-3 in FIG. 3(B)) stores the control value corresponding to the target output intensity, the light source unit may be driven with the control corrected value corresponding to the target output intensity higher than the target output intensity after setting or changing. In general, as the target output intensity p becomes lower, the temperature of the light emitting diode 11r becomes lower. Therefore, the inventors have recognized that, when the current output intensity (=p2) is increased to the target output intensity p1 after setting or changing, luminance of the light emitting diode 11r driven with the control value d1 is low due to a low temperature state of the light emitting diode 11r (a heat generation amount). In the illumination control unit 91 in FIG. 3, when the current output intensity (=p2) is increased to the target output intensity p1 after setting or changing, the light source unit 11, such as the light emitting diode 11r is driven with the increased control value (>d1). Therefore, the luminance of the illumination unit 10 can be precisely controlled.

When storing the control value corresponding to the target output intensity of the light source unit 11, the control unit 90 in FIG. 3 (the first control unit 90-3 in FIG. 3(B)) is able to store an assumed temperature of the light source unit 11 associated with the control value. The assumed temperatures corresponding to the control values d1 and d2 are, for example, T1 and T2, respectively (see FIG. 7). In step ST02 in FIG. 6, it is assumed that, for example, the temperature of the light emitting diode 11r is T, that, for example, the current output intensity data P of the light emitting diode 11r matches the target output intensity p1, and that the illumination control unit 91 drives the light emitting diode 11r with the control value d1. Specifically, the control unit 90 (the first control unit 90-3 in FIG. 3(B)) may consider a magnitude of a divergence between a current temperature (=T) and a current assumed temperature (=T1) when a difference between the current temperature (=T) and the assumed temperature (=T1) associated with the current control value (d1) corresponding to the current output intensity (=p1) is equal to or greater than a threshold (a second threshold or a temperature threshold). More specifically, the control unit 90 (the first control unit 90-3 in FIG. 3(B)) is able to compare the current temperature (=T), the current assumed temperature (=T1), and an assumed temperature T2 associated with the control value d2 corresponding to the target output intensity p2 after setting of changing.

When the current temperature (=T) differs more greatly from the current assumed temperature (=T1) than from the assumed temperature T2 after setting or changing, that is, when T<T2<T1, the control unit 90 is able to lower the correction value Δ. When the current temperature (=T) differs more greatly from the assumed temperature T2 after setting or changing than from the current assumed temperature (=T1), that is, when T2<T1<T, the control unit 90 is able to increase the correction value Δ. When the current temperature (=T) is between the assumed temperature T2 after setting or changing and the current assumed temperature (=T1), that is, when T2<T<T1, the control unit 90 (the first control unit 90-3 in FIG. 3(B)) is able to lower the correction value Δ.

In step ST05 in FIG. 6, the control unit 90 (the first control unit 90-3 in FIG. 3(B)) is able to determine the correction value as described above. In step ST04, when the difference between the target output intensity and the current output intensity is not equal to or greater than a threshold, the control unit 90 (the first control unit 90-3 in FIG. 3(B)) omits step ST05, that is, the correction value can be set to zero. In step ST06, the control unit 90 (the first control unit 90-3 in FIG. 3(B)) is able to correct the control value based on the correction value, and the illumination control unit 91 is able to drive the light source unit 11 with the corrected control value. After the illumination control unit 91 drives the light source unit 11 based on the control corrected value, the control unit 90 (the first control unit 90-3 in FIG. 3(B)) is able to take in the current output intensity detected by the detection unit 40 (step ST07) and adjust the correction value so that the current output intensity matches the target output intensity (step ST09).

As an example, the illumination control unit 91 is able to gradually lower the correction value Δ so that the corrected control value d2' in FIG. 7 approaches the control value d2. The control unit 90 (the first control unit 90-3 in FIG. 3(B)) is able to adjust the correction value until the current output intensity detected real time in step ST07 becomes stable at the target output intensity (step ST08). When the current output intensity becomes stable at the target output intensity, the control unit 90 is able to update the current output intensity (step ST10). Specifically, the control unit 90 (the first control unit 90-3 in FIG. 3(B)) is able to employ a stable target output intensity as the current output intensity.

Figure 8:
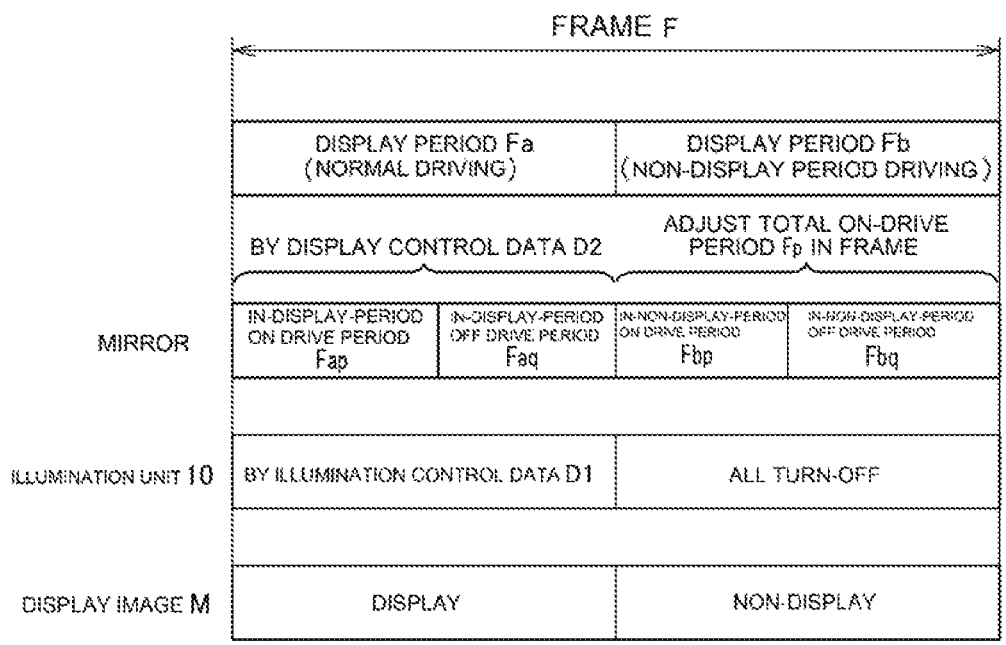
FIG. 8 is an explanatory diagram of a frame that is a period of displaying a display image in FIG. 2.

FIG. 8 is an explanatory diagram of a frame F that is a period of displaying the display image M in FIG. 2. The frame F includes a display period Fa in which each micromirror of the display element 30 is driven normally and a non-display period Fb in which the each micromirror is driven in a non-display period. The ratio of the display period Fa in the frame F is, for example, 50%, but it is not limited thereto, and it may be set to 70% or 100%, for example. The ratio of the display period Fa in the frame F may be constant or may be determined according to required luminance. The display period Fa is a period in which the illumination light C from the illumination unit 10 is projected as the display image M toward the screen 60. The non-display period Fb is a period in which the illumination unit 10 is turned off (e.g., all of the three light emitting diodes 11r, 11g, and 11b are turned off) (see FIGS. 9(D) to 9(F)).

An in-display-period ON drive period Fap is a period in which the micromirror is turned on in the display period Fa, and an in-display period OFF drive period Faq is a period in which the micromirror is turned off in the display period Fa. An in-non-display-period ON drive period Fbp is a period in which the micromirror is turned on in the non-display period Fb, and an in-non-display period OFF drive period Fbq is a period in which the micromirror is turned off in the display period Fb. When driving the micromirror, in order to prevent the micromirror from sticking, the display control unit 92 adjusts the in-non-display-period ON drive period Fbp and the in-non-display period OFF drive period Fbq such that, desirably, a sum of the in-display-period ON drive period Fap and the in-non-display-period ON drive period Fbp (a total ON drive period Fp) and a sum of the in-display period OFF drive period Faq and a in-non-display period OFF drive period Fbq (a total OFF drive period Fq) becomes substantially equal.

FIG. 9 is an explanatory diagram of a method for driving the display element 30 and the light emitting unit 10 in FIG. 3. As illustrated in FIGS. 9(A) to 9(C), in the frame F, the display element 30 may include, for example, a single color mirror Ea that displays green as a single color, a color mixing mirror Eb that displays mixed color of red and green, and a turn-off mirror Ec that displays nothing. A illustrated in FIG. 9(A), based on the display control data D2, the display control unit 92 is able to adjust the in-non-display-period ON drive period Fbp and the in-non-display period OFF drive period Fbq in the non-display period Fb such that the single color mirror Ea is turned on at turning on timing of the light emitting diode 11g (see FIG. 2(E)) in the display period Fa and, the total ON drive period Fp, which is the sum of ON periods in the frame F, becomes approximately the half of the frame F in the non-display period Fb.

As in the color mixing mirror Eb illustrated in FIG. 9(B), the display control unit 92 is able to make an adjustment such that the total ON drive period Fp and the total OFF drive period Fq become substantially equal by repeating ON and OFF in the non-display period Fb in a cycle according to the in-non-display-period ON drive period Fbp and the in-non-display period OFF drive period Fbq. Further, as illustrated in FIG. 9(C), since the turn-off mirror Ec is driven to off during the display period Fa, the non-display period drive can be turned on during the non-display period Fb.

The present invention is not limited to the exemplary embodiments described above, and those skilled in the art may easily modify the exemplary embodiments described above to the scope of the claims.

DESCRIPTION OF REFERENCE NUMERALS

10: Illumination unit
11: Light emitting unit 11r, 11g, 11b: Light emitting diodes
20: Illumination optical system
30: Display element
30P: Connecting portion
30-P: Pin
40, 40p, 40t1, 40t2: Detection units
41: Sensor
42: A/D converter
50: Projection optical system
60: Screen
70: Planar mirror
75: Concave mirror
80: Housing
81: Window portion
90, 90-1, 90-2, 90-3: Control units (e.g., serial/parallel converters (in a broad sense, video signal input units), microcontrollers, and power supply management ICs)
91: Illumination control unit (e.g., LED driver)
92: Display control unit (e.g., DMD controller)
92-H, 92-H[1], 92-H[2], 92-L, 92-L[3]: Circuit wiring
93H, 93H[1], 93H[2], 93L: Signal quality adjustment elements
94: Via portion
100: Head-up display device (in a broad sense, display device)
200: Windowshield
250: Driver
300: Video signal
CB1, CB2, CB3, CB4: Circuit boards
CB-1, CB-2, CB-3, CB-4, CB-5, CB-6: Layers
D1: Illumination control data
D2: Display control data
F: Frame
L: Display light
M1: Display image
SF: Subframe
V: Virtual image
d1, d2: Control values
d2': Corrected control value
Δ: Correction value

The invention claimed is:

1. A display device comprising:
an illumination unit that includes a light source unit capable of emitting light;
an illumination control unit that controls the illumination unit;
a display element capable of forming a display image with illumination light from the illumination unit;
a display control unit that controls the display element;
a control unit that controls the illumination control unit and the display control unit based on a video signal; and
a first circuit board on which the display element and the display control unit are mounted, wherein
based on the video signal, the display control unit transmits a first signal for controlling a plurality of pixels that form the display element to the display element and transmits a second signal for setting control of the plurality of pixels to the display element,
the display element drives the plurality of pixels based on the first signal and the second signal, and the display element and the display control unit are mounted on one of a front surface and a back surface of the first circuit board,
first wiring for transmitting the first signal is disposed only on the one of the front surface and the back surface,
the first circuit board is a multilayer circuit board including a first via portion that electrically connects the front surface and the back surface, and
second wiring for transmitting the second signal includes the first portion that is a first portion connecting the display control unit and the first via portion and is disposed only on the one of the front surface and the back surface, and
the second portion that is a second portion disposed only on the other of the front surface and the back surface and extends from the first via portion toward the display element.

2. The display device according to claim 1, wherein
the first signal includes a first differential signal transmitted at a first transmission rate by the first wiring,
the second signal includes a second differential signal transmitted at a second transmission rate by the second wiring, and
the first transmission rate is higher than the second transmission rate.

3. The display device according to claim 2, wherein a first signal quality adjustment element that adjusts a waveform of the first differential signal is disposed on the side of the display control unit, and a distance between the first signal quality adjustment element and the display control unit is shorter than a distance between the first signal quality adjustment element and the display element.

4. The display device according to claim 3, wherein
a second signal quality adjustment element that adjusts a waveform of the second differential signal is disposed on the side of the display control unit, a distance between the second signal quality adjustment element and the display control unit is shorter than a distance between the second signal quality adjustment element and the display element, and
the second signal quality adjustment element is formed inside the first portion of the second wiring disposed only on the one of the front surface and the back surface.

5. The display device according to claim 2, wherein
a second signal quality adjustment element that adjusts a waveform of the second differential signal is disposed on the side of the display control unit, a distance between the second signal quality adjustment element and the display control unit is shorter than a distance between the second signal quality adjustment element and the display element, and
the second signal quality adjustment element is formed inside the first portion of the second wiring disposed only on the one of the front surface and the back surface.

6. The display device according to claim 2, wherein
the multilayer circuit board that forms the first circuit board includes a first layer that forms the front surface, a second layer positioned immediately below the first layer, a third layer positioned below the second layer, and a fourth layer positioned immediately below the third layer, and
the fourth layer forms the back surface,
the second layer is a first ground layer, and
the third layer is a second ground layer.

7. The display device according to claim 1, wherein
the display control unit is a surface mount type circuit component, and is surface-mounted on the one of the front surface and the back surface, the display element is mounted on the one of the front surface and the back surface via an insertion type connector, and the second portion of the second wiring disposed only on the other of the front surface and the back surface connects the first via portion and the connector.

* * * * *